SHIFT REGISTER WITH BLOCKING OSCILLATOR STAGES USING
OVERSHOOT PULSES AS SEQUENCE TRIGGER PULSES

Filed Sept. 3, 1965

INVENTOR.
MASAO KAWASHIMA
MASAKATSU SAKAI &
TOSHIO KOBAYASHI
BY
KARL RATH
ATTORNEY

INVENTOR.
MASAO KAWASHIMA
MASAKATSU SAKAI &
TOSHIO KOBAYASHI
BY
KARL RATH
ATTORNEY

INVENTOR.
MASAO KAWASHIMA
MASAKATSU SAKAI &
TOSHIO KOBAYASHI
BY KARL RATH
ATTORNEY

United States Patent Office 3,432,683

Patented Mar. 11, 1969

3,432,683

SHIFT REGISTER WITH BLOCKING OSCILLATOR STAGES USING OVERSHOOT PULSES AS SEQUENCE TRIGGER PULSES

Masao Kawashima, Masakatsu Sakai, and Toshio Kobayashi, Kawasaki-shi, Japan, assignors to Fujitsu Limited, Kawasaki-shi, Japan Filed Sept. 3, 1965, Ser. No. 484,975

Claims priority, application Japan, Sept. 4, 1964, 39/50,773

U.S. Cl. 307—221 6 Claims

Int. Cl. H03k *21/00, 23/08, 23/22*

ABSTRACT OF THE DISCLOSURE

In a pulse shift register of the type comprising a plurality of one-shot blocking oscillator stages with means to utilize the main overshoot output pulses of one oscillator stage for sequence triggering the next oscillator stage, the overshoot pulses are shaped, as to amplitude and time position in relation to the clock pulses, by a common pulse-shaping network, consisting of a capacitor-resistor parallel circuit and operably connected, via individual diodes, to all the oscillator output stages. Auxiliary shaping circuits, also connected to the oscillator outputs and consisting of a resistor in series with a diode with or without a biasing battery, serve to suppress secondary overshoot pulses of reversed polarity following the main overshoot pulses.

This invention relates to improvements in or relating to blocking oscillator circuits, especially suitable for use as shift registers of electronic computers.

It is an object of the present invention to provide an improved blocking oscillator circuit capable of operating at a higher speed of operation.

It is a further object to provide a blocking oscillator circuit adapted to provide output pulses having more accurate and sharp forms than those obtainable by conventional circuits.

It is a still further object of the invention to provide an oscillator circuit of the above kind, which is reliable in its operation.

These and further objects, characterizing features and advantages of the present invention, will be better understood from the following detailed description, taken in conjunction with the accompanying drawings forming part of this specification and in which.

Figures 1, 2, 11:
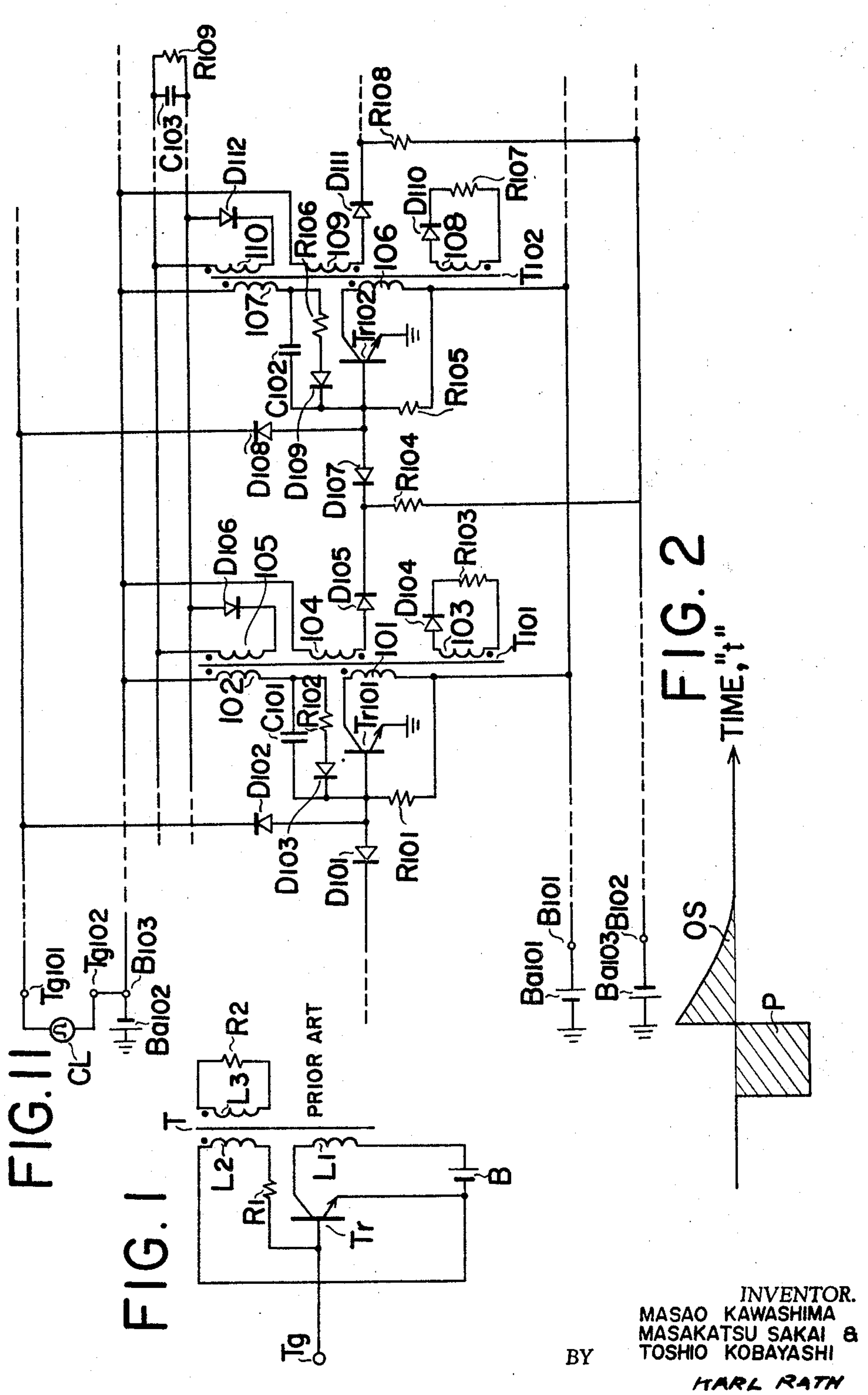
FIG. 1 is a schematic circuit diagram of a conventional blocking oscillator circuit.
FIG. 2 is a graph showing the collector voltage curve of the transistor included in the circuit shown in FIG. 1.
FIG. 11 is a more detailed circuit diagram, illustrating a still further embodiment of the invention.

Now referring to the accompanying drawings, especially FIG. 1 thereof, T*r* denotes a transistor; T*g* an input terminal through which the trigger signal is impressed; T is a transformer comprising windings L1, L2 and L3; B a D.C. voltage source; R1 a resistor for controlling the feedback current; and R2 a resistor representing the load inserted in the output of the circuit.

The output pulse from the transistor blocking oscillator shown in FIG. 1 is illustrated in FIG. 2 as a function of time $t$. As shown herein, an output pulse proper, denoted by P, is accompanied by an overshoot pulse, denoted by OS, the latter having a reversed polarity in comparison with that of the pulse P which may be referred to as "energized pulse." The overall amplitude is largest at the leading edge of the overshoot pulse.

Since the trailing overshoot pulse can be utilized as a memory signal for the energization of the blocking oscillator after termination of the energization, this trailing pulse is logically multiplied by a clock pulse conventionally employed in the art, so as to produce a logical product applied to the next succeeding similar oscillator of the register.

In order to provide a more stable shift register capable of increased operating speed, each of the constituent blocking oscillators must be designed to function in a similar way. Considering a two stage blocking oscillator as a part of a register chain, the energy of the overshoot signal developed in the first stage and supplied to the second stage must be correspondingly larger, in order to make the trigger signal fed to the latter stage to be a larger value, which signal is, as referred to hereinabove, a product of a clock pulse with the overshoot signal from the preceding stage.

In order to speed-up the operation of the shift register in a reliable and stable manner, the overshoot signal being part of the output pulse from each of the respective stages, especially during the clock pulse time when the next succeeding stage is to be energized, must be large enough for the desired purpose, yet, during a plurality of clock pulses developed thereafter, it must be damped to a smaller value for the prevention of unintentional energization of the oscillator stage under consideration. According to this invention, such a desired output wave form can be effectively attained.

Figures 3, 7, 10:
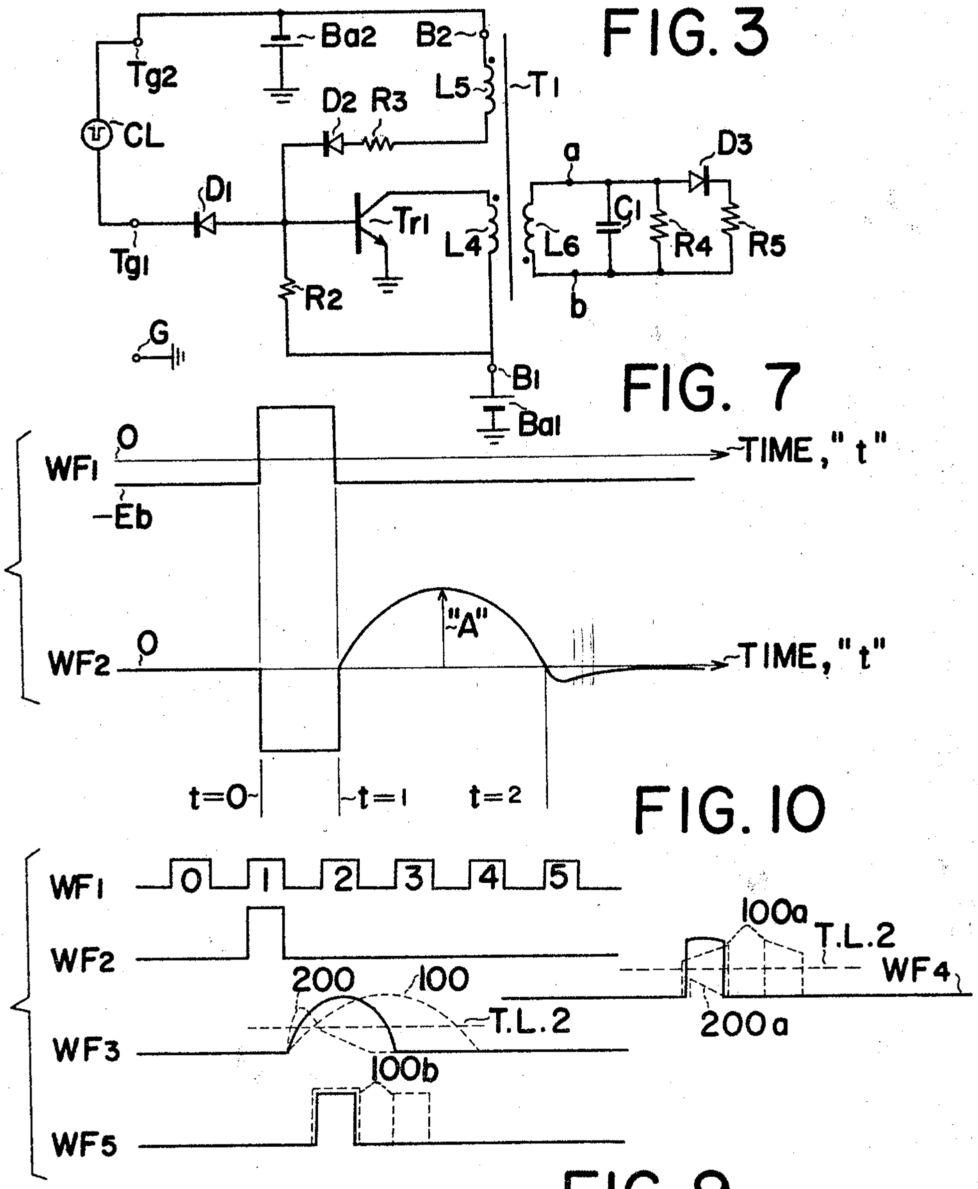
FIGS. 3–6 are circuit diagrams of several preferred embodiments of the present invention.
FIGS. 7 and 8 are voltage curves of the trigger signal pulse and output pulse obtained from the circuit arrangements shown in FIGS. 3 and 5, respectively.
FIG. 10 is a series of wave curves as appearing in the chain circuit shown in FIG. 9.

In FIG. 3, D1, D2 and D3 are diodes; T*r*1 is a n-p-n transistor; T1 is a transformer comprising windings L4, L5 and L6; R2, R3, R4 and R5 are resistors; C1 is a condenser; B*a*1 and B*a*2 are direct current sources; CL is a clock pulse voltage source which is electrically connected to terminals T*g*1 and T*g*2.

In FIG. 7, WF1 represents the clock pulse signal voltage as impressed upon terminal T*g*1 relative to ground denoted by symbol G in FIG. 3. The clock pulse is biased negatively by an amount of voltage E*b* of the voltage source B*a*2 so as to control the width of the output pulse by the clock pulse width at time. $t=1$ WF2 represents the voltage wave form at point *b* relative to that of point *a* shown in FIG. 3. The part of this wave ranging from $t=0$ to $t=1$ corresponds to the generated pulse or energized pulse, and the next following part of the wave beginning at the time point $t=1$ and continuing thereafter for a certain length of time is the overshoot wave. At $t=0$, the blocking oscillator starts to be energized, the energized condition continuing to the time point $t=2$. Diode D1 is inserted between the base electrode of transistor T*r*1 and the terminal T*g*1. At the time $t=1$, when the electric potential at terminal T*g*1 is lower than the base potential, that is, with the resistance of the diode D1 being of a small value, it is clamped to the terminal voltage —E*b* appearing at terminal T*g*1, and thus will become lower than the grounded emitter potential of the transistor T*r*1 which is thereby turned off, resulting in the termination of operation of the oscillator. During the time interval from $t=0$ to $t=1$, the energizing current flowing to winding L4 of transformer T1 which is electrically connected with the collector of transistor T*r*1 will amount to a certain value, expresssed by I*o* herein, and act to induce in transformer windings L5 and L6 a voltage having the reversed polarity to that of the generated pulse, whereby to black diodes D2 and D3 which are connected in series with windings L5 and L6, respectively, since the both diodes are so designed and arranged that they provide respectively a higher resistance value to the reverse induced voltage be induced therein in the above-described way. At this moment, a transient phenomenon will take place int the parallel circuit comprising winding L6, condenser C1 and resistor R4. As will be well understood by those skilled in the art, this transient phenomenon may have a pseudo-sinusoidarily damped wave form as illustrated by way of example in FIG. 7 by curve WF2 so as to represent a proper value of maximum amplitude A and a properly selected time point of half-period as at 2, by selecting proper values of resistance R4, inductance L6, capacitance C1 and the current value *Io* to be induced in the winding L6. In this way, the time point where the amplitude of the overshoot pulse is of the maximum possible value, as referred to hereinbefore with respect to FIG. 2, can be retarded nearly to at ime point where the triggering conditions of the next proceeding oscillator stage should be initiated.

At the time point $t=2$, when the damped trailing wave reverses its polarity for the first time, whereby diodes D2 and D3 will be turned to "on," and resistor R5 in series with diode D3; and an imaginary resistor R2×(number of windings at L6/number of windings at L5) are connected in parallel with resistor R4, a stronger damping effect will be imposed upon the transient phenomenon above referred to. When this damping effect is selected to be stronger than the critical damping value in this case, no further repeated vibrations oscillations will occur and the wave decreases to zero, as shown in the drawing. It may thus be realized to shape each of the overshoot waves so as to have a maximum energy value at the next succeeding triggering time point for the next following oscillator stage. When a shift register is composed of a number of oscillators of the above kind, it is possible to utilize clock pulses of larger amplitude, and further to suppress the otherwise possible, adversely affecting part of the overshoot wave, resulting thereby in a highly improved shift register capable of operating at a considerably higher speed under stable and highly reliable operating conditions. It may be also possible to shape the overshoot wave into one of non-vibrating character by selecting the damping factor for the transient phenomenon to be of a substantially larger value. In this case, the decreasing slope of the trailing damped wave will become considerably slower than is otherwise possible. Circuit data such as inductances of windings L4–L6 of transformer T1, resistances of R3–R4 and capacitance of C1 must be naturally selected within such range that they will satisfy the best possible energizing conditions of the blocking oscillator. In addition, such circuit elements as, for instance, resistors R3–R5, condenser C1 and the like, may be, if desired replaced by part of whole of the load in the oscillator. As shown, diode D2 is connected to the base electrode of transistor *Tr*1 and thus serves effectively as a protecting means therefor, since it functions substantially to suppress an overshoot voltage of a larger negative value from being impressed upon the base electrode of the transistor.

Figures 4, 5, 6, 8:
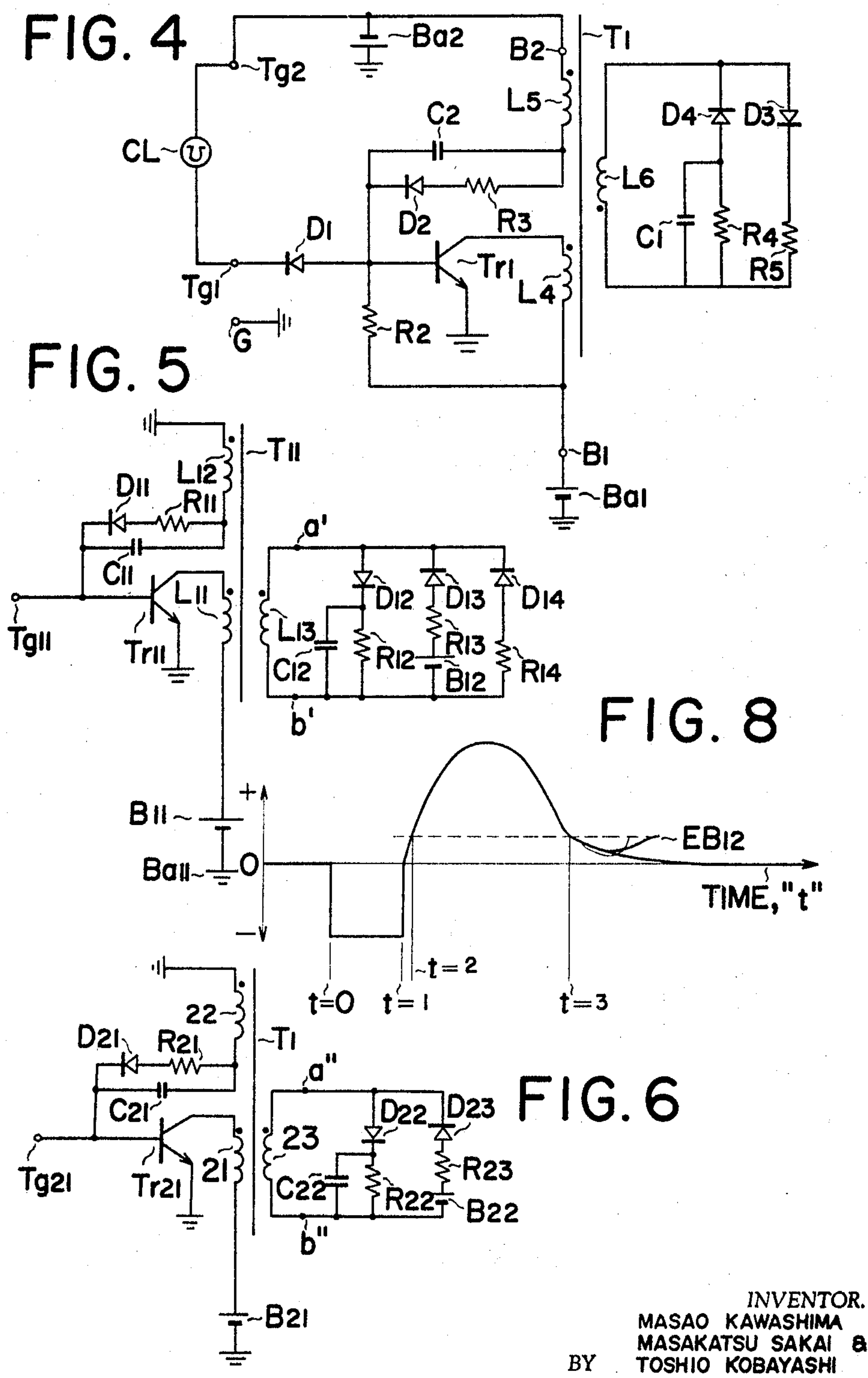

A further improved oscillator circuit of the foregoing one is illustrated in FIG. 4 wherein a further condenser C2 is provided between winding L5 and the base electrode and a diode D4 is provided in series with a parallel circuit comprising condenser C1 and resistor R4, the direction of the said diode D4 being selected in the reverse one to that employed in the foregoing embodiment, relative to diode D3 as well as transformer winding L6.

When the energization of the said oscillator is initiated, a voltage is induced in winding L6 of transformer T1 in the current-blocking direction for diode D4 and thus, in effect, condenser C1 and resistor R4 are released electrically from transformer winding L6. In this way, otherwise possible considerable current consumption through resistor R4, on the one hand, and the possible adverse effect upon the energized pulse wave will be substantially obviated, whereby the rising and falling characteristic of each output pulse may be considerably improved.

By the provision of condenser C2, higher frequency components of the positive feed-back current may be well bypassed so that the shaping of the generated pulses in the aforementioned manner is also considerably improved.

By shaping the overshoot wave as set forth in the foregoing, the overshoot signal varies gradually in comparison with sharp and clear rising as well as falling shape of the output pulses.

In FIG. 5, *Tr*11 denotes a transistor; D11–D14 are diodes; B11 and B12 are D.C. sources; R11–R13 are resistors; R14 is load shown in the form of a resistor; C11 and C12 are condensers; T11 is a transformer comprising three windings L11–L13; and *Tg*11 is an input terminal to which the trigger signal is applied.

Next, referring to FIG. 8, illustrating a voltage curve at point *a'* relative to point *b'*, the function of this arrangement will be described in detail hereinbelow:

At time point $t=0$, the oscillator is triggered to operate and at $t=t1$, returned to its non-energized conditions. Upon interruption of the transistor thus caused, an energizing current will be caused to flow through the transformer winding L11, whereby an overshoot wave of reverse polarity to that of the energizing pulse is caused to be induced in transformer winding L13 in the same manner already referred to. In this way, diodes D11 and D14 are made non-conductive, while diode D12 is made conductive, thus establishing an electrical connection thereof with the parallel arrangement of condenser C12 and resistor R12, as well as with the series arrangement of resistor R13 and voltage source B12. Thus, as in case of the foregoing embodiment, a transient wave is caused to develop which naturally depends on the above-mentioned circuit elements in addition to the inductance of transformer winding L13. It could be easily conceivable that, by selecting proper values of circuit elements, the transient wave may be transformed into a damped curve, nearly of the nature of a hyperbolic function as shown. Since, if the voltage overcomes the source voltage EB12 of battery B12 at time point, $t=t2$, diode D13 will be interrupted, thus suspending the damping action provided by resistor R13. By adopting proper values of circuit elements, the transient wave may easily be transformed into a pseudo-sinusoidal damped oscillation at this stage of operation.

The period and the maximum amplitude of the pseudo-sinusoidal damped oscillation wave may be chosen to have a desirous characteristic of overshoot wave as was referred to hereinbefore, by adopting a proper value of initial value of the energizing current and suitable values of such elements as L13, R12, R13, C12 and the like.

When the overshoot voltage becomes smaller than EB12 at $t=t3$, diode D12 is turned on again, whereby resistor R13 is connected in the circuit. Thus, it is possible effectively to dampen out the overshoot wave.

There are substantially two main operation modes of the oscillator as proposed by the present invention.

The first mode is such that a flow of the overshoot current through the load is permissible, but no current should flow through one or more resistors provided in the positive feed-back circuit.

In the second mode of operation, it is not permissible to have any overshoot current flowing through the load, but the current may flow through the resistor or resistors in the positive feed-back circuit.

If the said first mode of operation is desired, the overshoot damping resistor R13 shown in FIG. 5 may be replaced by the load resistor. In the second mode, the resistor can be replaced by the resistor R11.

The arrangement shown in FIG. 6 is suitable for carrying out the said first mode of operation. In this circuit, resistor R23 includes the loading resistor; D23 is a diode and B22 is a D.C. voltage source. By the provision of these elements, the required damping effect may be attained substantially in the same manner as provided by the corresponding elements D13, R13 and B12 shown in FIG. 5. Therefore, the overshoot voltage at point $a''$ relative to point $b''$ in FIG. 6 can be effectively damped out without converting its polarity into that allowing the current to pass through diode D21. Thus, again a re-triggering of the oscillator can be effectively suppressed. The second mode of operation referred to above may be carried into effect by reversing the polarity of the current fed from the battery B22. In this case, resistor R21 provided in the positive feed-back circuit will act substantially as the main active member for the damping operation. The current will flow through resistor R21 with the overshoot current damped-out.

For effectively suppressing possible noise output caused by the flow of current through the load, the polarity of voltage at B22 shown in FIG. 6 is reversed so as to provide diode D23 with a reverse bias. By employing such measure as described above, the overshoot wave is at first reversed in its polarity as the damping period proceeds, so that the diode D21 is turned to "on," while the diode D23 will maintain its non-conductive state during the whole period of the damping stage. Thus, no current will flow through the load.

The bias current as at B22 shown and illustrated herein may be supplied, if necessary, from a suitably designed self-biasing circuit known per se.

Figure 9:
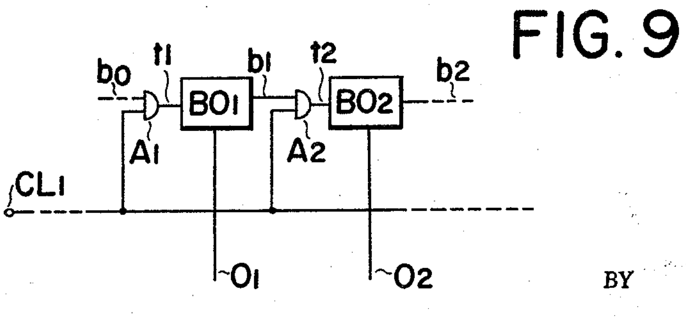
FIG. 9 is a block diagram, illustrating two series connected blocking oscillators as a part of a multi-stage shift register.

In FIG. 9, there are shown two successive stages of a number of, say 8, blocking oscillators having the required characteristics as described above and connected one after another in a series chain, so as to provide a shift register. In this drawing, BO1 and BO2 are the oscillators; A1 and A2 denote respectively logical product circuits known per se and schematically represented in block form; CL1 is a clock pulse input terminal; O1 and O2 are output terminals for delivering the output pulses. Symbols *b0*, *b1* and *b2* denote the overshoot signal channels, respectively and *t1* and *t2* represent the trigger signal channels.

Several wave forms are shown in FIG. 10, which appear at several points in the part of the shift register, FIG. 9, when the latter is in its regular and stable working condition.

More specifically in FIG. 10, WF1 denotes a series of clock pulses; WF2 an output pulse from the first oscillator stage BO1; WF3 an overshoot signal wave as appearing in the channel *b1* extending from the oscillator stage BO1; WF4 a trigger signal wave appearing in the channel *t2* extending to the second oscillator stage BO2; WF5 is an output pulse emanating from the second stage.

In the drawing, T.L.2 shows the trigger level in the second oscillator stage. Waveform WF3 shown in full line is that of the overshoot signal appearing, as already referred to, in the channel *b1* from the first stage BO1 is of the properly shaped form as was described hereinbefore. It has an ample amplitude relative to the said level T.L.2 in the second stage BO2 during the issuing period of clock pulse 2. As seen, this wave form has been damped to a satisfactorily small amplitude relative to the trigger level T.L.2 during the trailing period after the occurrence of clock pulse 3. As hinted by the representation of WF4, the trigger signal appearing in the channel *t2*, as shown by full lines, overcomes the trigger pulse level of the second stage BO2 only during the occurrence of clock pulse 2, thereby to trigger the second oscillator stage BO2. A dotted line curve attached with numeral 100 is an example of too long an overshoot signal occurring at channel *b1* of the first oscillator stage BO1. In this case, trigger signal appearing at channel *t2* will be as schematically represented by a dotted line curve 100*a* in the representation of WF4. In this case, the second oscillator stage BO2 would be triggered by two successive clock pulses 2 and 3, whereby two successive output pulses as hinted by dotted lines 100*b* would be produced.

With too short an overshoot signal developed by the first stage and appearing at channel *b1*, as hinted by dotted lines 200 in the representation of WF3, the trigger signal fed to the second stage will be such as hinted by dotted lines 200*a* in the representation of WF4. In this case, this signal does not overcome in any way the trigger signal level T.L.2 of the blocking oscillator BO2, so that the latter cannot be triggered at the required time and the shift register could not operate properly.

In FIG. 11, only two blocking oscillator stages of the shift register are shown, each of said stages being designed and arranged to operate according to the principles of the present invention, as set forth in the foregoing in reference to FIGS. 3–6.

Transformers T101 and T102 are each fitted with two additional windings as at 104 or 109 and 105 or 110, respectively. The former serves for delivering overshoot signals to be fed each to the next following oscillator stage. The latter serves for shaping the respective overshoot signals. Resistors R103 and R107 function for damping out the unnecessary part of the respective overshoot wave. CL denotes the source for delivering the clock pulses of the positive polarity to inlet terminal T*g*101. B*a*101–B*a*103 are D.C. bias voltage sources which may be of the self-biasing type as already referred to.

Condenser C103 and resistor R109 serve for properly shaping the overshoot waves as referred to hereinbefore, and for this purpose are connected through diodes D106 and D112, respectively, to the corresponding blocking oscillator stages.

Diodes D106 and D112 herein shown will function in the same manner as at D4 in FIG. 4, and at the same time they serve to connect, in common, both condenser C103 and resistor R109 desirously for desirously shaping the overshooting waves in the manner described.

Diodes D105 and D111 serve to interrupt the control signal circuit for the next following oscillator stage during the resting period of the respective blocking oscillators. More specifically, diodes D105 and D111 may be interrupted during each energizing period of the respective blocking oscillators, and conversely, they are made conductive during the overshooting period of these oscillators.

By employing the above-mentioned procedures, the following substantial improvements in the characteristics of the novel blocking oscillators can be attained;

During the energized period of the oscillator, the overshoot wave shaping elements do not provide any load to the oscillator, whereby the output pulse per se may have a sharp and stable wave form.

With use of the oscillator arrangement shown in FIG. 11, an impression of such trigger pulses as having too large an amplitude to the input terminal is prevented. More specifically, the danger of destroying the transistor by energizing the latter through feeding a too high energizing voltage in excess of the prescribed maximum allowable voltage to the base-collector and base-emitter current paths, respectively, may be substantially obviated.

It is therefore possible to design the output windings 104 and 109 of transformers T101 and T102, respectively, so as to have a large number of turns, thus providing the further advantage of driving the output winding of each oscillator stage by larger control signals and only during the desired time intervals, resulting thereby in increased speed of operation of the shift register.

While the invention has been shown and described as embodied in several preferred embodiments, it is not intended to limit the same to the details shown, since various modifications and changes may be made thereto without departing from its broader scope and spirit.

We claim:

1. A pulse shift register comprising in combination:

(1) a plurality of cascaded one-shot blocking oscillator stages each having an input and an output, (2) product-forming coupling circuits interposed between adjoining oscillator stages of the cascade and each having first and second inputs and an output, (3) means to apply clock pulses simultaneously to all the first inputs of said coupling circuits, (4) further means to apply the output pulses to each oscillator stage, excepting the last stage of the cascade, to the second input of the coupling circuit connecting the respective stage with the next following stage, (5) means to apply the output pulses of each of said coupling circuits to the input of the next following oscillator stage, (6) whereby to effect sequence triggering of one oscillator stage by the main output overshoot pulses of the preceding stage, and (7) a common overshoot pulse shaping network coupled with the outputs of all said oscillators through individual unidirectional conducting devices arranged to pass the main overshoot output pulses of the respective stages.

2. In a pulse shift register as claimed in claim 1, said pulse shaping circuit designed to cause the peak amplitude of the main overshoot pulses of said oscillators to substantially coincide with the clock pulses following the respective preceding main oscillator output pulses.

3. In a pulse shift register as claimed in claim 1, said pulse shaping network being comprised of an RC-parallel circuit and said unidirectional conducting devices serially connecting said circuits with the outputs of the respective oscillators.

4. In a pulse shift register as claimed in claim 1, each of said oscillators including an output transformer having a primary winding, a feedback winding and a secondary winding, and said shaping network consisting of an RC-parallel circuit connected to the secondary windings of said oscillators in series with diodes acting as unidirectional conducting devices.

5. In a pulse shift register as claimed in claim 4, including a tertiary winding of each of said transformers, and a separate damping circuit connected to each of said tertiary windings and comprising a diode in series with a damping resistance, said diode arranged to pass the next half-wave pulse of opposite polarity following the main pulses of the periodic overshoot waves of said oscillators.

6. A blocking oscillator for use in pulse shift registers and the like comprising in combination:

(1) a transistor having a base, an emitter and a collector, (2) means electrically connected to said transistor for feeding thereto a series of electric control pulses, (3) an output transformer having primary, secondary and feedback windings, the former and the latter coupling said collector with said base, (4) a first circuit comprised of a resistor and condenser in parallel and connected across said secondary winding, said secondary winding adapted to deliver a combination of a rectangular pulse followed directly by a trailing overshoot signal and said parallel circuit acting for delaying the maximum amplitude of said overshoot signal, and (5) a further circuit comprised of a resistor, a diode and a D.C. voltage source in series and connected in parallel to said first circuit.

References Cited

UNITED STATES PATENTS

| | | | |
|---|---|---|---|
| 2,939,040 | 5/1960 | Isabeau | 331—112 X |
| 3,025,412 | 3/1962 | Felker | 331—112 X |
| 3,131,315 | 4/1964 | Morwald | 307—88.5 |
| 3,158,753 | 11/1964 | Creveling | 307—88.5 |
| 3,184,612 | 5/1965 | Petersen | 307—88.5 |
| 3,268,811 | 8/1966 | Jefferson | 331—112 X |

OTHER REFERENCES

Krajewski: "Transistor Circuits for a IMC/S Digital Computer," Electronic Engineering, July 1959, pp. 403–407.

ROY LAKE, *Primary Examiner.*

JAMES B. MULLINS, *Assistant Examiner.*

U.S. Cl. X.R.

307—275; 328—37, 59